Aug. 17, 1954 WEN YUAN PAN ET AL 2,686,879

WIDE RANGE ULTRAHIGH-FREQUENCY OSCILLATOR

Filed Oct. 29, 1951

INVENTORS
WEN YUAN PAN AND
CHARLES W. WITTENBURG
BY H. L. Hewston
ATTORNEY

Patented Aug. 17, 1954

2,686,879

UNITED STATES PATENT OFFICE 2,686,879

WIDE RANGE ULTRAHIGH-FREQUENCY OSCILLATOR

Wen Yuan Pan and Charles W. Wittenburg, Collingswood, N. J., assignors to Radio Corporation of America, a corporation of Delaware Application October 29, 1951, Serial No. 253,648

9 Claims. (Cl. 250—40)

This invention relates generally to oscillation generators, and particularly relates to a resonant structure suitable especially as the frequency determining circuit of an oscillator and tunable over an appreciable portion of the ultra-high frequency (U. H. F.) spectrum.

The U. H. F. band from 470–890 megacycles (mc.) has tentatively been allocated for broadcasting television signals. A tunable circuit structure in accordance with the present invention is particularly adapted for tuning, for example, the local oscillator of a U. H. F. converter over a similar U. H. F. range to provide a modulated carrier wave at a desired intermediate frequency which normally falls in one of the very high frequency (V. H. F.) television channels. The converter oscillator must be tuned to frequencies below the corresponding signal frequencies to maintain the proper relation between the picture and sound carriers. In this case, the higher the intermediate frequency of the converter, the larger the tuning ratio which the local oscillator must cover. If the intermediate frequency (I. F.) is, for example, 82 mc., the tuning ratio which the local oscillator must cover is in excess of two to one. The copending application to Wen Yuan Pan, filed May 29, 1951, Serial No. 228,891 entitled "Tunable Circuit Structure" and assigned to the assignee of this application discloses a U. H. F. oscillator which will cover such a frequency range. The oscillator disclosed in the Pan application consists essentially of a tuned or resonant parallel wire transmission line. The resonant frequency of the transmission line is varied by connecting across its open or far end a variable capacitance device. Consequently, when the transmission line is open, a standing half wave pattern is formed and the transmission line resonates at the high frequency end of its tuning range. On the other hand, when the transmission line is bridged or essentially short-circuited by the capacitance device which also includes inductance, a standing quarter wave is developed along the transmission line. The transmission line can now be tuned to cover the low frequency end of its tuning range.

While the previously disclosed oscillator hereinabove referred to will cover the desired U. H. F. tuning range, the relationship between the movement of the tuning core and the resulting variation of the resonant frequency of the structure is linear over a frequency ratio of the order of 1.85 to 1.0 which is satisfactory for application to U. H. F. superheterodyne receivers where the oscillator frequency is above the signal frequency.

For application to U. H. F. converters, however, it has been found that it is difficult to track the oscillator accurately with the radio-frequency input circuit of a superheterodyne converter because the tuning curve of the oscillator cannot readily be matched with that of the radio-frequency input circuit over the entire tuning range. Furthermore, with the known oscillator the dial calibrations of the converter are not equally spaced and stations broadcasting at the middle portion of the U. H. F. television range are crowded together. Finally, the oscillator must be aligned or adjusted during production to compensate for unavoidable tolerances of the lead lengths and the values of other circuit components. However, if this is done, accurate tracking between the oscillator resonant structure and the radio-frequency input circuit is still more difficult to achieve.

It is accordingly an object of the present invention to provide a movable core type tunable resonant circuit structure for a U. H. F. oscillation generator which has a substantially linear relationship between the movement of the tuning core and the resulting variation of the resonant frequency of the structure over a U. H. F. frequency range of more than two to one.

A further object of the invention is to provide a tunable resonant circuit structure for a U. H. F. oscillator suitable for use in a superheterodyne receiver for receiving television signals within the U. H. F. band from 470–890 mc., which can readily be tracked with the radio-frequency input circuit of the receiver and which can easily be aligned or adjusted during production to compensate for unavoidable differences of the conductor or lead lengths and other necessary tolerances of the component parts of the circuit structure.

Another object of the invention is to provide an oscillation generator for a superheterodyne receiver adapted to receive television signals within the U. H. F. band referred to which will provide a tuning dial having substantially equidistant calibrations to facilitate tuning in of a desired station.

Still a further object of the invention is to provide an oscillation generator which will develop sufficient oscillatory energy over a wide frequency range within the U. H. F. band.

In accordance with the present invention the entire tuning range of the previously described oscillator is still further extended. This makes it possible to utilize an intermediate portion of the tuning range which has the desired linear relationship between the movement of the tuning core and the resulting oscillator frequency variation. In accordance with the present invention, the two-wire transmission line consists essentially of one conductor such as a metallic rod and an inductor. One end of the conductor and one terminal of the inductor are electrically connected through a capacitance device of the type disclosed in connection with the Pan oscillator referred to. Thus, the metallic rod and the inductor may each be connected to a separate conductive capacitance member or metallic plate, the two plates being spaced apart and electrically insulated from each other. A conductive tuning element or metallic core is movable with respect to the two metallic plates to provide a pair of capacitors between the core and each of the plates, while the tuning core itself provides inductance.

The inductor which forms part of the two wire transmission line preferably also is provided with a metallic tuning core to vary the inductance of its associated inductor. In this manner the tuning range of the circuit structure may be considerably extended at it high frequency end and the tuning curve may be made more nearly linear over an intermediate portion of the tuning range.

The novel features that are considered characteristic of this invention are set forth with particularity in the appended claims. The invention itself, however, both as to its organization and method of operation, as well as additional objects and advantages thereof, will be best understood from the following description when read in connection with the accompanying drawing, in which:

Figure 1:
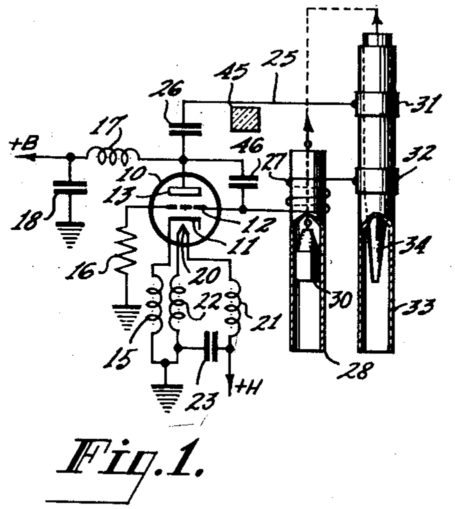
Figure 1 is a circuit diagram and schematic representation of the oscillation generator of the present invention.

Referring now to the drawing wherein like elements are designated by the same reference numerals through the figures, and particularly to Figure 1, there is illustrated an oscillation generator including an amplifier tube 10. The amplifier tube 10 may be a triode as shown, having a cathode 11, a control grid 12 and an anode 13. The cathode 11 is grounded through an inductor 15 and the control grid 12 through a grid leak resistor 16. The anode 13 is supplied with a suitable anode voltage from a source indicated at +B through a choke coil 17 which may be bypassed to ground for alternating-frequency currents by a capacitor 18. The cathode 11 is indirectly heated through a filament 20 which is supplied with a suitable heater voltage from a source indicated at +H through the inductor 21 and the inductor 22, the latter being grounded. The inductors 21 and 22 are also bypassed to ground for alternating-frequency currents through capacitor 23.

The resonant circuit structure of the present invention is connected between the control grid 12 and the anode 13 and may be considered a two-wire transmission line. The two-wire transmission line includes a conductor 25 coupled to the anode 13 through the capacitor 26. The second wire of the two-wire transmission line is formed essentially by the inductor 27 which is directly connected to the control grid 12. The conductor 25 may consist of a suitable conducting material such, for example, as a copper or Kovar wire which is preferably silver plated. The conductor 25 may have a diameter of $\frac{1}{32}$ of an inch and a length of 1 inch. The inductor 27 is connected to the control grid 12 through a very short lead.

Preferably the inductor 27 consists of a metallic helical coating provided on the outer surface of a hollow tube 28 insulating material having a low dielectric constant. Thus, the tube 28 may, for example, consist of glass having a low dielectric constant. The tube 28 may have an outer diameter of .250 inch and an inner diameter of .205 inch. The inductor 27 may consist of a metallic coating or plating forming a strip of, for example, 2½ turns, the strip being $\frac{3}{64}$ of an inch wide and the turns being spaced $\frac{1}{64}$ of an inch. The metallic coating forming the inductor 27 may, for example, be provided by a copper layer having a thickness of 1 mil, a .3 mil silver layer and a .2 mil tin layer superposed on each other. A conducting core 30 which may consist of a suitable metal such, for example, as brass is movable within the tube 28 and preferably has one of its ends tapered as shown.

The two wire transmission line consisting of the conductor 25 and the inductor 27 has its two open or far ends bridged by a capacitance device including a pair of metallic coatings or plates 31 and 32 which are provided on the outer surface of a cylindrical hollow tube 33 of an insulating material having a high dielectric constant. The tube 33 may have an outer diameter of ¼ of an inch and a wall thickness of 25 mils. The tube 33 may, for example, also consist of glass. The metallic coatings or sleeves 31 and 32 may be provided by silver plating the tube 33 and they are connected respectively to the conductor 25 and the inductor 27. A metallic core 34 is movable within the tube 33 and may, for example, also consist of brass. Preferably, one end portion of the core 34 is tapered as shown.

Figure 2:
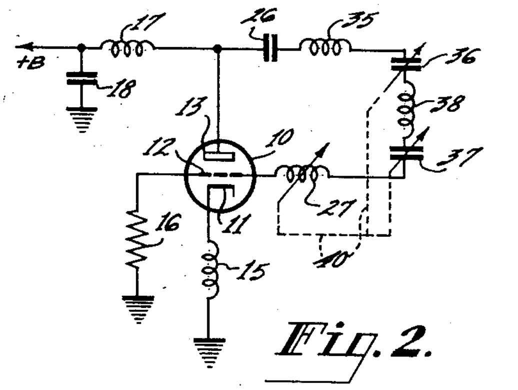
Figure 2 is an equivalent circuit diagram of the oscillator of Figure 1.

Figure 2 illustrates the equivalent circuit of the oscillation generator of Figure 1. An inductor 35 represents the inductance of the conductor 25 in Figure 1. The capacitors 36, 37 indicate respectively the capacitance between the coating 31 and the core 34 and between the coating 32 and the core 34. An inductor 38 represents the inductance of the core 34 between the two coatings or plates 31, 32.

Accordingly, the resonant circuit structure of the invention consists essentially of a series resonant circuit. This series resonant circuit includes the capacitor 26, the inductor 35, the capacitor 36, the inductor 38, the capacitor 37 and the inductor 27 connected serially between the anode 13 and the control grid 12. Movement of the tuning core 30 with respect to its inductor 27 will vary the inductance of the inductor 27 as indicated in Figure 2. Furthermore, movement of the tuning core 34 with respect to its associated coatings 31, 32 will vary the capacitance of the capacitors 36, 37. As indicated by the dotted line 40, the capacitors 36, 37 and the inductor 27 are preferably variable in unison by moving both tuning cores 30 and 34 together.

In describing the operating of the oscillation generator of the invention, it will first be assumed that the two tuning cores 30 and 34 are in the positions shown in Figure 1. Hence, the tuning core 30 is outside of the inductor 27 and the tuning core 34 is in register with both plates 31, 32. The transmission line consisting of the conductor 25 and the inductor 27 is now electrically bridged in the manner explained and the equivalent circuit of the oscillator corresponds to that shown in Figure 2. A standing quarter wave is developed in the transmission line because it is electrically short-circuited and the oscillator oscillates at the low frequency end of its tuning range. The effective length of the quarter wave line is extended by the capacitors 36, 37 and the inductor 38 bridging the far ends of the transmission line. The effective length of the transmission line for quarter wave operation is further extended by the tube 33 having a high dielectric constant which effectively reduces the velocity of the electromagnetic wave traveling across the far ends of the transmission line. Finally, the interelectrode capacitance between the control grid 12 and the anode 13 which is of the order of 1.5 micromicrofarads has an appreciable impedance at the lower end of the frequency range corresponding to quarter wave operation and also tends to extend the effective length of the transmission line. The inductor 27 has relatively little influence on the operation of the oscillator at the low end of the tuning range.

In order to tune the resonant circuit structure toward the high frequency end of the tuning range both tuning cores 30 and 34 are moved in unison toward the top of Figure 1. Finally, the two tuning cores reach their second extreme position where the tuning core 30 is within the inductor 27 and hence reduces its effective inductance. The tuning core 34 in its second extreme position is out of register with the capacitance plate 32 and hence the transmission line is effectively open at its far ends.

Accordingly, the tuning core 34 has now little effect on the operation of the transmission line and the dielectric constant of the tube 33 substantially does not affect the length of the transmission line. The interelectrode grid-plate capacitance of the tube 10 has a considerably smaller impedance at the high frequency end and hence does not substantially extend the effective length of the transmission line which, of course, would reduce the tuning range.

The tube 28 consists of a material having a low dielectric constant because a dielectric material will reduce the frequency of the oscillator which is undesirable. The oscillator frequency is plotted in Figure 3 as a function of the tuning stroke, that is, the movements of the tuning cores 30 and 34. The curve 42 shown in full lines indicates the operation of the oscillator of the invention while the dotted curve 43 indicates the operation of an oscillator where the core 30 in the inductor 27 is removed. It will be seen that the provision of the variable inductor 27 extends the tuning range at the high frequency end and makes the relationship between tuning stroke and frequency substantially linear over an extended frequency range.

Figure 3:
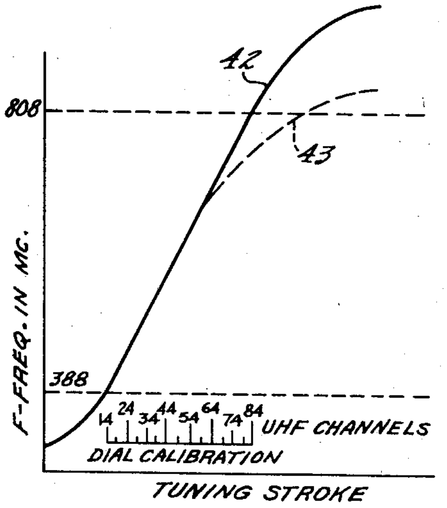
Figure 3 is a graph illustrating the relationship between the resonant frequency of the circuit structure of the oscillator of Figure 1 and the tuning stroke.

If the oscillator is designed for a U. H. F. converter for receiving television signals within the U. H. F. frequency range between 470–890 mc. and if the intermediate frequency is 82 mc., the required oscillator range is from 388–808 mc. as indicated in Figure 3. It will be seen that within this tuning range the relationship between the oscillator frequency and the tuning stroke is substantially linear. Actually the linear range extends from about 375 to about 815 mc., thus facilitating alignment of the oscillator during production. The total frequency range of the oscillator of the invention is between about 300 and about 1,000 mc.

The oscillator frequency at the low end of the tuning range may be adjusted by an adjustment of the tuning core 34. An adjustment of the tuning core 30 will control or adjust the oscillator frequency at the high frequency end of the tuning range. Furthermore, it is feasible to provide a dielectric core 45 adjacent to the conductor 25. By moving the dielectric core 45 at right angles to the conductor 25, a further slight adjustment of the oscillator frequency within the high frequency portion of the tuning range may be effected.

In order to reduce the frequency drift of the oscillator during warm-up, it is feasible to provide a capacitor 26 and a capacitor 46 having suitable temperature coefficients to compensate for the change of reactances of the capacitors and inductors of the resonant circuit structure caused by temperature changes.

In Figure 3 the dial calibrations indicating the television stations from channels 14–83 have been illustrated. It will be seen that the distance between stations is substantially equal at either end of the tuning range.

There has thus been disclosed a resonant circuit structure suitable for a U. H. F. oscillation generator which has a substantially linear relationship between the tuning stroke and the resulting resonant frequency of the structure. This substantially linear frequency curve has a sufficiently wide frequency range for the local oscillator of a superheterodyne receiver or converter to cover the U. H. F. television band. It will facilitate tracking and provide for equidistant dial calibrations. Furthermore, adjustments during production to compensate for the necessary tolerances of the circuit components may easily be effected. Finally the oscillator of the invention will develop sufficient oscillatory energy over the required tuning range.

What is claimed is:

1. A resonant circuit structure comprising a conductor, an inductor having terminals, two conductive capacitance members disposed in spaced relationship to each other, one member being in electrical contact with one end of said conductor, the other member being in electrical contact with one terminal of said inductor, a first conductive tuning element movable with respect to said two capacitance members and electrically insulated therefrom to provide effectively a variable capacitance between said element and said members, and a second conductive tuning element movable with respect to said inductor to vary its inductance, thereby to provide a series resonant circuit tunable over a predetermined portion of the U. H. F. range.

2. A resonant circuit structure tunable over a predetermined portion of the U. H. F. range comprising a conductor, an inductor having terminals, two conductive capacitance members disposed in spaced relationship to each other, one member being in electrical contact with one end of said conductor, the other member being in electrical contact with one terminal of said inductor, a first conductive tuning element movable with respect to said two members and electrically insulated therefrom to provide effectively a variable capacitance between said element and each of said members, and a second metallic tuning element movable with respect to said inductor and in unison with said first tuning element to vary the inductance of said inductor, thereby to provide a series resonant response characteristic variable over said predetermined portion of the U. H. F. range.

3. A resonant circuit structure tunable over a predetermined portion of the U. H. F. range comprising a conductor, an inductor having terminals, two metallic capacitance members disposed in spaced apart relationship, one member being in electrical contact with one end of said conductor, the other member being in electrical contact with one terminal of said inductor, said inductor and said conductor forming effectively a resonant parallel wire transmission line, a first metallic tuning element movable with respect to said two members and insulated therefrom to provide a variable capacitance between said element and each of said members electrically bridging one end of said line, said first tuning element having a first extreme position wherein it is disposed closely adjacent to both of said members to extend the effective length of said transmission line and having a second extreme position wherein it is disposed closely adjacent to one of said members only, and a second metallic tuning element movable with respect to said inductor, thereby to provide a series resonant circuit tunable over a wide frequency range having an intermediate portion with a substantially linear relationship between the variation of the resonant frequency of said circuit and the movement of said elements.

4. A resonant circuit structure as defined in claim 3 wherein a hollow cylindrical tube is provided of a material having a high dielectric constant, and wherein said capacitance members consist of metallic coatings provided on the outer surface of said tube.

5. A resonant circuit structure as defined in claim 4 wherein said first tuning element is disposed within said tube and has one of its end portions tapered.

6. A resonant circuit structure as defined in claim 3 wherein a dielectric device is adjustably disposed adjacent to said conductor for adjusting the resonant frequency of said structure within the upper portion of its tuning range.

7. A resonant circuit structure as defined in claim 3 wherein a hollow cylindrical tube is provided of an insulating material having a low dielectric constant, said inductor being disposed on the outer surface of said tube.

8. A resonant circuit structure as defined in claim 7 wherein said second tuning element is disposed within said tube and has one of its end portions tapered.

9. A resonant circuit structure as defined in claim 3 wherein said tuning elements are moved in unison.

References Cited in the file of this patent

UNITED STATES PATENTS

| Number | Name | Date |
|---|---|---|
| 2,340,749 | Harvey | Feb. 1, 1944 |
| 2,403,349 | Dolberg | July 2, 1946 |
| 2,469,168 | Loughlin | May 3, 1949 |
| 2,562,263 | Ehrlich | July 31, 1951 |
| 2,601,445 | Murakami | June 24, 1952 |